(12) United States Patent
Zhang et al.

(10) Patent No.: US 9,640,635 B2
(45) Date of Patent: May 2, 2017

(54) RELIABILITY IN MERGEABLE SEMICONDUCTOR DEVICES

(71) Applicants: Zhihong Zhang, Chandler, AZ (US); Daniel J. Blomberg, Chandler, AZ (US); Hongning Yang, Chandler, AZ (US); Jiang-Kai Zuo, Chandler, AZ (US)

(72) Inventors: Zhihong Zhang, Chandler, AZ (US); Daniel J. Blomberg, Chandler, AZ (US); Hongning Yang, Chandler, AZ (US); Jiang-Kai Zuo, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 14/832,139

(22) Filed: Aug. 21, 2015

(65) Prior Publication Data
US 2015/0364576 A1    Dec. 17, 2015

Related U.S. Application Data

(62) Division of application No. 14/047,348, filed on Oct. 7, 2013, now Pat. No. 9,117,841.

(51) Int. Cl.
*H01L 29/78* (2006.01)
*H01L 27/01* (2006.01)
(Continued)

(52) U.S. Cl.
CPC .. *H01L 29/66659* (2013.01); *H01L 21/26513* (2013.01); *H01L 21/823481* (2013.01);
(Continued)

(58) Field of Classification Search
CPC .......... H01L 29/66659; H01L 29/1045; H01L 29/7835; H01L 21/26513; H01L 29/0847; H01L 29/0642; H01L 29/1095; H01L 29/66575; H01L 21/823481; H01L 29/78615; H01L 29/78654; H01L 29/78624; H01L 29/7833; H01L 29/6659
(Continued)

(56) References Cited

U.S. PATENT DOCUMENTS 4,746,624 A * 5/1988 Cham ................. H01L 21/0337
257/408
5,536,957 A * 7/1996 Okumura .......... H01L 21/26586
257/336

(Continued)

FOREIGN PATENT DOCUMENTS

WO       2012028077 A1    3/2012

*Primary Examiner* — Marcos D Pizarro
*Assistant Examiner* — Nelson Garces
(74) *Attorney, Agent, or Firm* — Rajeev Madnawat

(57) ABSTRACT

A method of fabricating a transistor device having a channel of a first conductivity type formed during operation in a body region having a second conductivity type includes forming a first well region of the body region in a semiconductor substrate, performing a first implantation procedure to counter-dope the first well region with dopant of the first conductivity type to define a second well region of the body region, and performing a second implantation procedure to form a source region in the first well region and a drain region in the second well region.

20 Claims, 4 Drawing Sheets

(51) Int. Cl.
*H01L 21/336* (2006.01)
*H01L 29/66* (2006.01)
*H01L 29/786* (2006.01)
*H01L 21/265* (2006.01)
*H01L 29/06* (2006.01)
*H01L 29/08* (2006.01)
*H01L 29/10* (2006.01)
*H01L 21/8234* (2006.01)
*H01L 29/36* (2006.01)
*H01L 27/088* (2006.01)
*H01L 21/761* (2006.01)
*H01L 21/762* (2006.01)

(52) U.S. Cl.
CPC ...... *H01L 29/0642* (2013.01); *H01L 29/0847* (2013.01); *H01L 29/1045* (2013.01); *H01L 29/1095* (2013.01); *H01L 29/6659* (2013.01); *H01L 29/66575* (2013.01); *H01L 29/786* (2013.01); *H01L 29/7833* (2013.01); *H01L 29/7835* (2013.01); *H01L 29/78615* (2013.01); *H01L 29/78624* (2013.01); *H01L 29/78654* (2013.01); *H01L 21/761* (2013.01); *H01L 21/76224* (2013.01); *H01L 21/823418* (2013.01); *H01L 27/088* (2013.01); *H01L 29/0653* (2013.01); *H01L 29/36* (2013.01)

(58) Field of Classification Search
USPC .................................................. 257/342–352
See application file for complete search history.

(56) References Cited

U.S. PATENT DOCUMENTS

| | | | |
|---|---|---|---|
| 5,917,219 A * | 6/1999 | Nandakumar | H01L 29/1045 257/327 |
| 7,329,922 B2 | 2/2008 | Shibib et al. | |
| 7,776,700 B2 | 8/2010 | Yang et al. | |
| 2011/0049621 A1* | 3/2011 | Lotfi | H01L 21/823807 257/337 |
| 2011/0108917 A1* | 5/2011 | Shima | H01L 29/0847 257/344 |
| 2012/0175679 A1* | 7/2012 | Marino | H01L 29/402 257/194 |
| 2013/0026569 A1 | 1/2013 | Hao | |
| 2013/0270635 A1* | 10/2013 | Parris | H01L 29/66659 257/336 |

* cited by examiner

US 9,640,635 B2

RELIABILITY IN MERGEABLE SEMICONDUCTOR DEVICES

CROSS-REFERENCE TO RELATED APPLICATION

This application is a divisional application of U.S. application Ser. No. 14/047,348, entitled "Mergeable Semiconductor Device with Improved Reliability" and filed Oct. 7, 2013, the entire disclosure of which is hereby incorporated by reference.

FIELD OF INVENTION

The present embodiments relate to semiconductor devices.

BACKGROUND

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Transistor devices are often designed to be tolerant of the high currents and voltages that are present in applications such as motion control, air bag deployment, and automotive fuel injector drivers. High voltage transistor devices may have a number of features customized to prevent breakdown resulting from the high electric fields arising from such high voltages. The potential for damage from high energy charge carriers increases with the higher operating voltages achieved as a result of the design features. The higher operating voltages lead to higher electric fields, which, in turn, increase the energy imparted to the charge carriers within the device. Device degradation often arises from the injection of high energy charge carriers, or hot carriers, into the gate oxide, an interlayer dielectric, or field oxide structure of the device. The resulting buildup of charge in the dielectrics from such hot carrier injection (HCI) leads to variations in operational characteristics, such as the threshold voltage or on-state current, and performance of the device, such as performance at high frequencies.

High voltage transistor devices are also susceptible to the generation of secondary charge carriers through impact ionization. In an n-channel transistor device, electrons may generate additional electron-hole pairs after being accelerated in a region having a high electric field, such as near the drain boundary. If a sufficient number of holes—the secondary charge carriers—are created to raise the potential of the body of the transistor device to an extent that the junction with the source is forward biased, activation of a parasitic npn bipolar transistor formed via the source (emitter), body (base), and drain (collector) regions of the transistor device can occur. Very large, damaging currents can result via the activation of the parasitic bipolar transistor, an operating condition referred to as "snapback."

High voltage devices are often characterized by a "safe operating area" (SOA) in which the operating current and voltage levels are below levels that would result in a snapback event. Attempts to remain within the safe operating area to avoid device destruction or other damage are often undesirably limiting factors for device operation and application.

Transistor devices are often merged with one another to achieve area savings. Merging transistor devices typically involves placement of the transistor devices within a common isolation ring. The merged transistor devices may thus share a common body. Unfortunately, conventional mergeable transistor device designs typically exhibit unacceptably HCI degradation and poor SOA. Conversely, many transistor devices designed for HCI immunity and good SOA are not mergeable.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
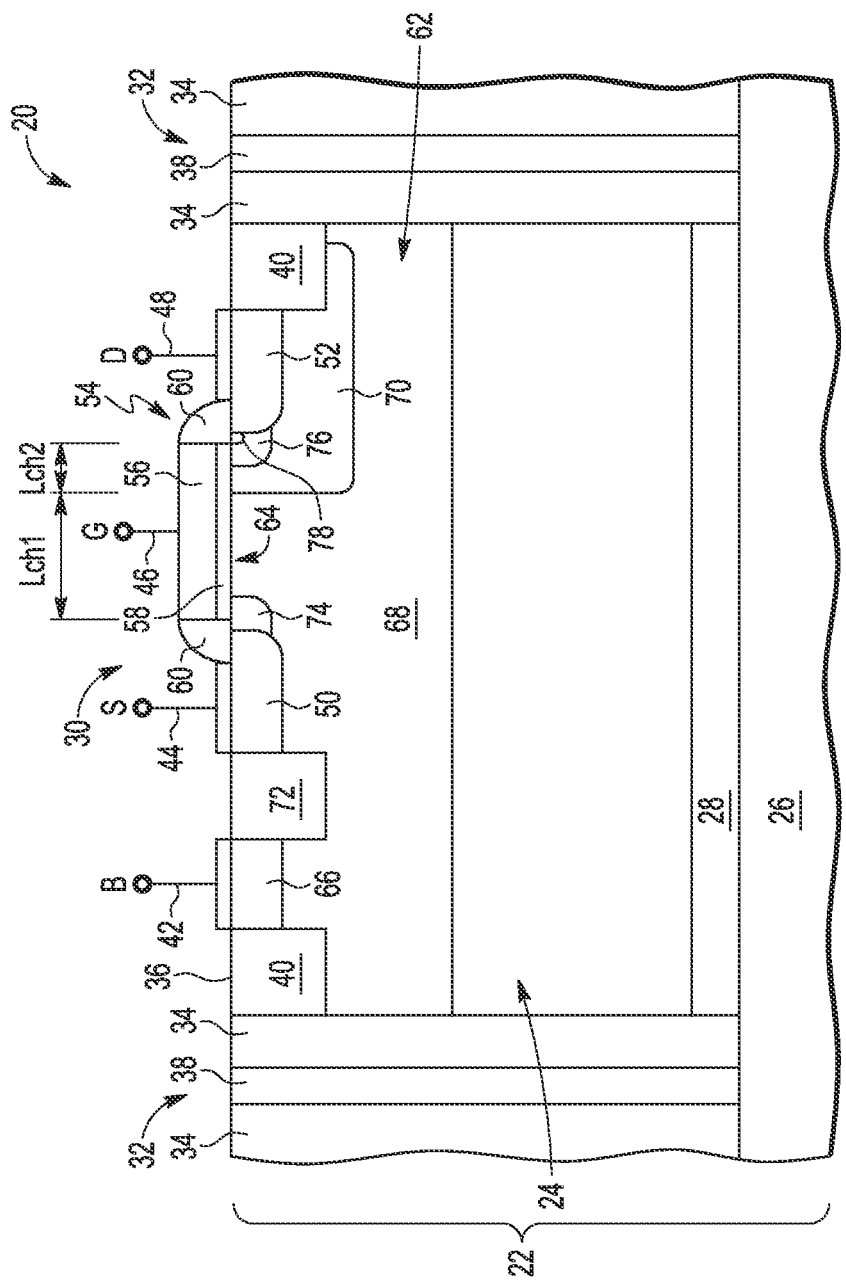
FIG. 1 is a cross-sectional, schematic view of an exemplary mergeable transistor device having a counter-doped drain-side body region and a drain extension depletion pocket in accordance with one embodiment.

Semiconductor devices having a lighter doped drain-side body region and/or a drain extension depletion pocket are described. Methods of fabricating such devices are also described. The semiconductor devices may be field-effect transistor (FET) devices, such as those configured for use as analog FET devices. The drain-side body region and the drain extension depletion pocket may improve the operational reliability of the semiconductor devices. Improvements may be realized in one or more operational characteristics, including decreased hot carrier injection (HCI) degradation, improved safe operating area (SOA), and better time-dependent dielectric breakdown (TDDB) performance in connection with the gate oxide of the FET devices.

The improved reliability of the disclosed devices may be useful in various applications involving analog FET devices. In one embodiment, the disclosed device is configured as an analog FET device for operation with drain bias voltages of about 5 Volts or more (e.g., about 5.5 Volts), although other operating voltages may be used.

The disclosed devices may be configured as mergeable devices. In some embodiments, the disclosed devices are mergeable in the sense that multiple instances of the devices may be disposed within a common isolation ring. The disclosed devices are mergeable despite the incorporation of one or both of the design enhancements to improve reliability. Multiple devices may be disposed within a common isolation ring, e.g., with a common device body and at a common body bias voltage. Less area may thus be consumed by trench or isolation rings, which, in some cases, present a large area penalty.

The drain-side body region and/or drain extension pocket also do not adversely affect other device operational parameters, such as device mismatch. Either feature may be incorporated into a FET design without giving rise to greater levels of mismatch between units of the disclosed devices intended to present identical performance characteristics, e.g., identical current levels for a given bias voltage. Mismatch issues may be avoided due to the device-wide coverage of a primary well region of the device body, extending across source, drain, and channel regions of the device. The lack of patterning of the primary well region within the device area avoids creating a well-proximity effect that could lead to higher mismatch. The disclosed devices may thus be well suited for a variety of analog applications.

The drain-side body region may be defined by counter-doping the primary well region. The counter-doping of the primary body well region, which may be a heavily doped region, may include a light or lighter shallow dopant implantation of opposite conductivity type. In some cases, an existing FET implantation procedure configured to form an accumulation region of a power FET device is used as the shallow dopant implantation. The lower effective or net dopant concentration level of the drain-side body region may reduce the electric field at or near the drain region of the disclosed devices. The reduced electric field may, in turn, lower degradation due to HCl. The reduction may be enhanced in some cases by the segregation effects at a silicon/gate oxide interface of boron and phosphorus dopants.

The drain extension pocket may be disposed in a drain extension region, e.g., a lightly doped drain (LDD) region, along a drain-side edge of a gate structure. The pocket has an opposite conductivity type of the drain extension region, thereby creating a depletion region. The depletion region further reduces the electric field at the substrate surface near the gate edge to help further reduce HCl degradation and improve the SOA of the device. The depletion region also reduces the voltage at the drain-side gate edge while the device is operating in, for instance, a blocking state. The reduced voltage may thus lead to improvements in accumulation mode TDDB. The pocket may be formed with an implantation procedure configured to form a FET terminal extension region, such as a source/drain extension region, for a FET device having a channel of the opposite conductivity type as the present device. For example, in n-channel embodiments, a p-type LDD (PLDD) implantation procedure may be used to form the pocket in the drain extension region, which may, in turn, be formed with a deeper, n-type LDD (NLDD) implantation procedure.

The devices described herein may be configured via one or more implantation procedures directed to fabricating one or more other types of FET devices. The disclosed devices may thus be fabricated using a process flow for fabricating such other FET devices, such as power MOSFET and/or logic MOSFET devices. The fabrication of the disclosed devices may thus avoid adding implants, masks, or other fabrication steps to an existing process flow. Process steps are not added despite the optimization of the steps of the existing process flow for the power and/or logic FET devices. The use of existing implantation procedures allows the disclosed devices to be fabricated cost effectively.

Although described below in connection with a silicon-on-insulator (SOI) substrate, the disclosed devices and fabrication methods may be used with other substrate types and fabrication technologies. The manner in which the disclosed devices are isolated from neighboring devices or the semiconductor substrate may also vary. The configuration, depth, construction, materials and other characteristics of isolation regions may vary. For instance, the disclosed devices and methods are not limited to device arrangements having shallow trench isolation (STI) regions for intra-device isolation or deep trench isolation (DTI) regions for inter-device isolation.

Although described below in connection with n-channel FET devices, the disclosed devices are not limited to any particular transistor polarity configuration. N-channel FET devices are described and illustrated herein for convenience of description and without any intended limitation. However, p-channel devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel MOSFET device 20 constructed in accordance with one embodiment. The device 20 includes a semiconductor substrate 22, which may, in turn, include a number of epitaxial layers 24. In this example, the semiconductor substrate 22 includes a single p-type epitaxial layer grown on a base or original substrate 26. The original substrate 26 may include a lightly or heavily doped p-type or n-type substrate (e.g., a handle wafer), and may include one or more epitaxial layers. In this example, a lightly doped n-type substrate may be used. The device 20 may alternatively or additionally include non-epitaxial layers in which one or more device regions are formed. Any one or more of the layers of the semiconductor substrate 22 may include silicon. Other semiconductor materials may be used, including both elementary and compound semiconductor materials.

In this example, the semiconductor substrate 22 has an SOI construction having a buried insulator layer 28. The buried insulator layer 28 may include, for example, a silicon oxide, e.g., $SiO_2$, layer having a thickness of about 0.1 to about 3.0 µm, but other thicknesses, materials, and layers may be used.

The structural, material, and other characteristics of the semiconductor substrate 22 may vary from the example shown. For example, the semiconductor substrate 22 may include a non-epitaxial semiconductor layer disposed on the buried insulating layer 28. Additional, fewer, or alternative layers may be included in the semiconductor substrate 22. Any number of additional semiconductor and/or non-semiconductor layers may be included. For example, a buried device isolating layer may be disposed on the original substrate 26 or the buried insulator layer 28. The buried device isolating layer may act as a seed layer for growth of the epitaxial layer 24. The disclosed devices are thus not limited to, for instance, SOI or bulk substrates, or substrates including epitaxially grown layers, and instead may be supported by a wide variety of other types of semiconductor substrates.

A portion of a device area 30 is depicted in FIG. 1. The device area 30 may include a portion that mirrors the depicted portion, an example of which is described and shown in connection with FIG. 2. In other embodiments, the device 20 is symmetrical about other device active areas or not symmetrical. The device area 30 may be defined by an isolation ring 32. In this example, the isolation ring 32 includes one or more isolation trenches or regions 34. The isolation trenches 34 may be configured as deep trench isolation (DTI) regions that extend from a surface 36 of the semiconductor substrate 22 to the original substrate 26 or the buried insulator layer 28 to define a lateral periphery of the device 20. One or more of the isolation trenches 34 may be contiguous with the insulating layer 28 as shown. The device area 30 may also be defined by one or more doped isolating layers or regions 38 in the epitaxial layer 24. In some cases, the doped isolating layers or regions 38 are configured as an n-type or p-type isolation ring that extends through the epitaxial layer 24 and past the insulating layer 28 to reach the original substrate 26. Alternatively or additionally, the regions 38 are made of polysilicon. The isolation trenches 34 and the doped isolating region 38 may thus laterally and/or otherwise surround the device area 30. These layers or regions act as a barrier separating the device area 30 from the rest of the substrate 22 or the original substrate 26.

In this example, the buried insulator layer 28 extends laterally across (e.g., under) the device area 30 of the device 20 to act as a vertical barrier separating the device area 30 from the original substrate 26 and other neighboring devices. Alternatively or additionally, the perimeter of the device area 30 includes a substrate tie used to bias the original substrate 26. The device 20 may include any number of doped or non-doped isolating regions surrounding the device area 30.

The lateral extent of the device area 30 may also be defined by one or more additional trench isolation regions. In this example, the device area 30 is further defined by a shallow trench isolation (STI) region 40 disposed at the surface 36 of the semiconductor substrate 22. In this example, the surface 36 corresponds with an upper surface of the epitaxial layer 24. The STI region 40 may be ring-shaped. In this example, the STI region 40 is disposed adjacent an inner one of the DTI regions 34. The STI region 40 may be used to provide further separation between an active area for a substrate tie and the active areas of the device 20. The trench of the STI region 40 may be filled with silicon oxide and/or other materials.

The device 20 includes a body terminal 42, a source terminal 44, a gate terminal 46, and a drain terminal 48 supported by the semiconductor substrate 22. The terminals 42, 44, 46, 48 are spaced from one another along the surface 36. Contacts and/or interconnects may be provided for electrically connecting each terminal 42, 44, 46, 48 to respective regions or structures in or on the semiconductor substrate 22. The contacts and/or interconnects may be formed with any one or more metal or conductive materials using any deposition procedure.

The device 20 includes a source region 50 and a drain region 52 disposed in the epitaxial layer 24 of the semiconductor substrate 22. The source and drain regions 50, 52 are laterally spaced from one another along the surface 36. In this example, the source and drain regions 50, 52 are doped sufficiently n-type to establish ohmic contacts with the source and drain terminals 44, 48.

The source and drain regions 50, 52 are disposed on opposite sides of a gate structure 54 of the device 20. The gate structure 54 is supported by the semiconductor substrate 22. The gate structure 54 is configured to control formation of a channel along a conduction path between the source and drain regions 50, 52 during operation. The gate structure 54 may be formed on or above the surface 36 of the semiconductor substrate 22. The gate structure 54 includes a conductive layer 56, e.g., a polysilicon layer, disposed on a gate oxide layer 58, e.g., silicon dioxide, which, is, in turn, disposed on the surface 36 of the semiconductor substrate 22. The conductive layer 56 and the gate oxide layer 58 of the gate structure 56 are disposed laterally between the source and drain regions 50, 52. In this example, the gate structure 54 further includes dielectric spacers 60 disposed along sidewalls of the conductive and gate oxide layers 56, 58. The dielectric spacers 60 may laterally overlap the source and drain regions 50, 52. The gate oxide layer 58 may have a thickness configured for analog applications. For instance, the gate oxide layer 58 may have a thickness greater than oxide layers in logic FET devices. In some cases, the thickness is about 5 nm to about 20 nm, although other thicknesses may be used.

The device 20 includes a composite body region 62 disposed in the epitaxial layer 24 of the semiconductor substrate 22. In this example, the constituent regions of the composite body region 62 have p-type conductivity. During operation, a channel is formed in a channel portion 64 of the composite body region 62 for charge carriers flowing from the source region 50 to the drain region 52. A body contact region 66 of the composite body region 62 is disposed at the surface 36. The body contact region 66 may have a dopant concentration level sufficient to establish an ohmic contact with the body terminal 42 to bias the composite body region 62.

The composite body region 62 may include a nested well arrangement. The nested well arrangement may improve operational reliability without degrading other performance characteristics of the device 20, such as mergeability and mismatch characteristics. In this embodiment, the nested well arrangement includes a primary well region 68 that extends laterally across the source and drain regions 50, 52, and a secondary or nested well region 70 disposed in or on the primary well region 68. Additional wells may be included in other embodiments. The secondary well region 70 has a lower effective or net dopant concentration level than the primary well region 68. The lower concentration level may lead to lower electric field levels at or near the drain region 52. The lower electric field may, in turn, result in less energy imparted to the majority charge carriers in the channel region 64 near the drain region 52, thereby reducing degradation from hot carrier injection (HCI). On the other hand, if the source side body doping in the primary well region 68 is also reduced, the body resistance will increase, which may lead to poor SOA for the device 20.

The secondary well region 70 is disposed on the drain side of the composite body region 62 and, in this example, the device area 30. The drain region 52 is disposed in or on the secondary well region 70. The secondary well region 70 extends laterally outward from the gate structure 54 toward the drain side of the device 20. The secondary well region 70 laterally overlaps the gate structure 54 to define primary and secondary sections of the channel region 64 having lengths $L_{ch1}$ and $L_{ch2}$, respectively. The section of the channel region 64 along the length $L_{ch1}$ is formed in the primary well region 68 and the section of the channel region 64 along the length $L_{ch2}$ is formed in the secondary well region 70. The secondary well region 70 is thus positioned such that majority charge carriers in the channel region 64 flow from the primary well region 68 into the secondary well region 70 to reach the drain region 52. Notwithstanding the overlap with the channel region 64, the secondary well region 70 is laterally positioned on the drain side of the device area 30 and may thus be referred to as a drain-side well region 70.

The length $L_{ch1}$ of the primary section of the channel region 64 may vary, along with the width of the device 20, to achieve a desired level of current for the device 20. The length $L_{ch2}$ of the secondary section may be selected to achieve a desired reliability level in one or more of the parameters addressed herein. In some examples, the length $L_{ch2}$ of the secondary section falls in a range from about 0.1 µm to about 0.5 µm, e.g., about 0.4 µm.

The drain-side well region 70 may be formed by counter-doping the primary well region 68. For example, the drain-side well region 70 may be formed with an n-type implantation procedure both shallower and lighter than the p-type implantation procedure used to form the primary well region 68. With such counter-doping, the drain-side well region 70 thus includes dopant of the opposite conductivity type, e.g., n-type, of the primary well region 68 to have a lower effective or net dopant concentration level than the primary well region 68.

The drain-side well region 70 may be considered to be disposed or nested within the primary well region 68 despite the presence of the STI region 40 along outer edges of the well regions 68, 70. The drain-side well region 70 has a lower boundary spaced from the lower boundary of the primary well region 68. In some cases, the spacing falls in a range from about 0.2 µm to about 2 µm, although other spacings may be used. An outer edge of the drain-side well region 70 may be spaced from the isolation ring 32. In contrast, the primary well region 68 may extend the entire lateral width of the active area 32. The primary well region 68 may thus abut the isolation ring 32 along each lateral side of the device 20.

The electric field at the drain side is reduced by counter-doping the relatively deep and heavy p-type primary well region 68 at the drain side of the device area 30 with a relatively light and shallow n-type implant. HCI immunity and SOA may accordingly be improved. The reduction may be enhanced in some embodiments in which the counter-doping is enhanced by dopant segregation at the silicon/silicon oxide interface at the surface 36. For example, boron and phosphorus may have opposite segregation effects at the interface, e.g., thermal oxidation may lead to boron deficiency and phosphorus pile-up in the substrate 22 at the surface beneath the gate oxide layer 58.

The improvements in HCI immunity and SOA can be achieved while maintaining the mergeability of the device 20. Mergeability refers to whether the device 20 is compatible with arrangements in which one or more semiconductor devices, e.g., transistor devices, are disposed within the same isolation ring as the device 20. The device 20 is mergeable because of the configuration of the composite body region 62. The arrangement, e.g., a nested arrangement, of the primary well region 68 and the drain-side well region 70 allows the device 20 to share the composite body region 62 with other devices. The dopant concentration level of the primary well region 68 may also be sufficiently high to isolate the respective drain regions of the merged devices from one another. Merging devices within the same isolation ring may help avoid a significant area penalty that would be introduced by the addition of another isolation ring. In contrast, conventional active or field drift FET devices are not mergeable because the drain is not enclosed by a well with the opposite conductivity type.

The well arrangement of the composite body region 62 may also avoid issues associated with the well proximity effect. The primary well region 68 extends laterally across the entire device area 30. The primary well region 68 thus covers each of the source, drain, and channel regions 50, 52, 64. The implantation of p-type dopant to form the primary well region 68 is thus not patterned in the vicinity of the channel region 64. Variations in threshold voltage and other well-proximity effects, which can arise from dopant ions reflecting off photoresist into the channel region 64, may thus be avoided. The mismatch performance of the device 20 is accordingly not degraded. A consistent threshold voltage of the device 20 is established by the heavier doping of the primary well region 68.

In the example of FIG. 1, the body contact region 66 is disposed on the source side of the primary well region 68. A further STI region 72 may be disposed at the surface 36 to space the body contact region 66 from the source region 50. The body contact region 66 may be provided at other locations with the device area 30.

The composite body region 62 may include fewer, additional, or alternative well regions and/or other constituent regions. For example, in some embodiments, the composite body region 62 does not include the drain-side well region 70.

Further or alternative improvements in operational reliability may be realized through the introduction of a depletion region at a drain-side edge of the gate structure 54. The depletion region may be disposed within one of the source/drain extension regions. In the embodiment of FIG. 1, the device 20 includes a source extension region 74 adjacent the source region 50 and a drain extension region 76 adjacent the drain region 52. The source and drain extension regions 74, 76 may be disposed in the epitaxial layer 24 at the surface 36. The source and drain extension regions 74, 76 extend laterally inward from the source or drain region 50, 52 under the gate structure 54, e.g., past the sidewall spacers 60, to allow charge carriers to reach the channel from the source region 50, and reach the drain region 52 from the channel, during operation. The charge carriers thus pass through the drain extension region 76 after exiting the channel region 64. The source and drain extension regions 74, 76 may be configured as n-type lightly or moderately doped drain (LDD) regions, or NLDD regions.

The drain extension region 76 may include a pocket 78 along a drain-side edge of the gate structure 54 to form the depletion region. In this example, the pocket 78 is a p-type region. The pocket 78 may be configured to establish a depletion region along a junction with the n-type drain extension region 76. The pocket 78 is disposed along the edge of the gate structure 54 at the surface 36 of the semiconductor substrate 22. In this example, the pocket 78 is also disposed along an edge of the drain region 52. The other sides or boundaries of the pocket 78 may be surrounded by the drain extension region 76. In other embodiments, the drain region 52 may be farther spaced from the channel region 64.

The lower boundary of the pocket 78 is shallower than the lower boundary of the drain extension region 76. In one example, the lower boundary of the drain extension region 76 is at a depth of about 0.05 µm to about 0.5 µm, while the lower boundary of the pocket is at a depth of about 0.01 µm to about 0.2 µm, but other depths may be used. The lateral extent of the pocket 78 may also vary. In one example, the channel-side boundaries of the drain extension region 76 and the pocket 78 are spaced apart by about 0.01 µm to about 0.1 µm.

The depletion region established by the oppositely doped pocket 78 in the drain extension region 76 near the edge of the gate structure 54 helps further reduce the electric field at the surface 36, e.g., at the edge of the gate structure 54. HCI immunity may thus be improved. The presence of the pocket 78 may also reduce the voltage at the drain-side edge of the gate structure 54 when in the blocking state. Accumulation mode TDDB and SOA performance may thus also be improved, including in embodiments having multiple gates.

The device 20 is shown in simplified form. For example, FIG. 1 does not show a number of metal layers configured for electric coupling with the body, source, gate, and drain terminals 42, 44, 46, and 48 and other device structures. The device 20 may have a number of other structures or components for connectivity, isolation, passivation, and other purposes not shown in FIG. 1 for ease in illustration. For instance, the device 20 may include any number of additional isolating regions or layers. In some examples, another p-type or n-type epitaxial layer (not shown) may be disposed between the original substrate 26 and the device area 30. One or more further STI regions, other isolation trenches, and/or isolation wells (not shown) may be provided to isolate the device area 30 and/or other region of the device 20.

The dopant concentrations, thicknesses, and other characteristics of the above-described semiconductor regions in the semiconductor substrate 22 may vary. For example, the dopant concentration of the original substrate 26 may vary considerably.

In some embodiments, one or more doped regions of the device 20 are formed with existing dopant implantation procedures associated with the fabrication of one or more regions of FET device designs supported by the process flow. For example, the existing implantation procedures may be directed to fabricating a high voltage or power FET device, e.g., an LDMOS device, a high or low voltage analog FET device, or a low voltage or logic FET device. The dopant concentration, ion energy, implant angle, and/or other characteristics of the implants may thus vary in accordance with the parameters established by the FET device design(s).

In the embodiment of FIG. 1, existing dopant implantation procedures associated with the fabrication of one or more other FET device designs may be used to form each doped region. For example, the effective or net dopant concentration level of the drain-side well region 70 may be established through counter-doping with an implantation procedure configured to form a well region of a power FET device, such as an LDMOS transistor device. The well region may be configured for use as an accumulation or drift region of the power FET device. In the example of FIG. 1, the implantation procedure may be directed implant n-type dopant to compensate for the p-type doping of the epitaxial layer 24 to form an n-type accumulation region. The procedure may be referred to herein as a power FET n-comp procedure. The dopant concentration level achieved by the compensation implantation procedure may be configured to support a dopant concentration on the same order of magnitude as the epitaxial layer 24. The dopant concentration level may fall in a range from about $5 \times 10^{15}/cm^3$ to about $1 \times 10^{17}/cm^3$. The compensation implantation procedure may also have an energy level configured for a shallow depth, which may be useful in forming the accumulation and/or drift region of an LDMOS transistor device.

The pocket 78 may be formed by a power FET terminal (e.g., source/drain) extension implantation procedure configured to form a lightly or moderately doped region, such as a lightly doped drain (LDD) region of a p-channel power FET device. In the example of FIG. 1, the power FET source/drain extension implantation procedure may thus be a p-type LDD (PLDD) implant.

The primary well region 68 of the composite body region 62 may be formed with an implantation procedure also configured to form a body region of an n-channel power FET device, such as an LDMOS transistor device. The procedure may be referred to herein as a power FET p-well procedure.

Figure 2:
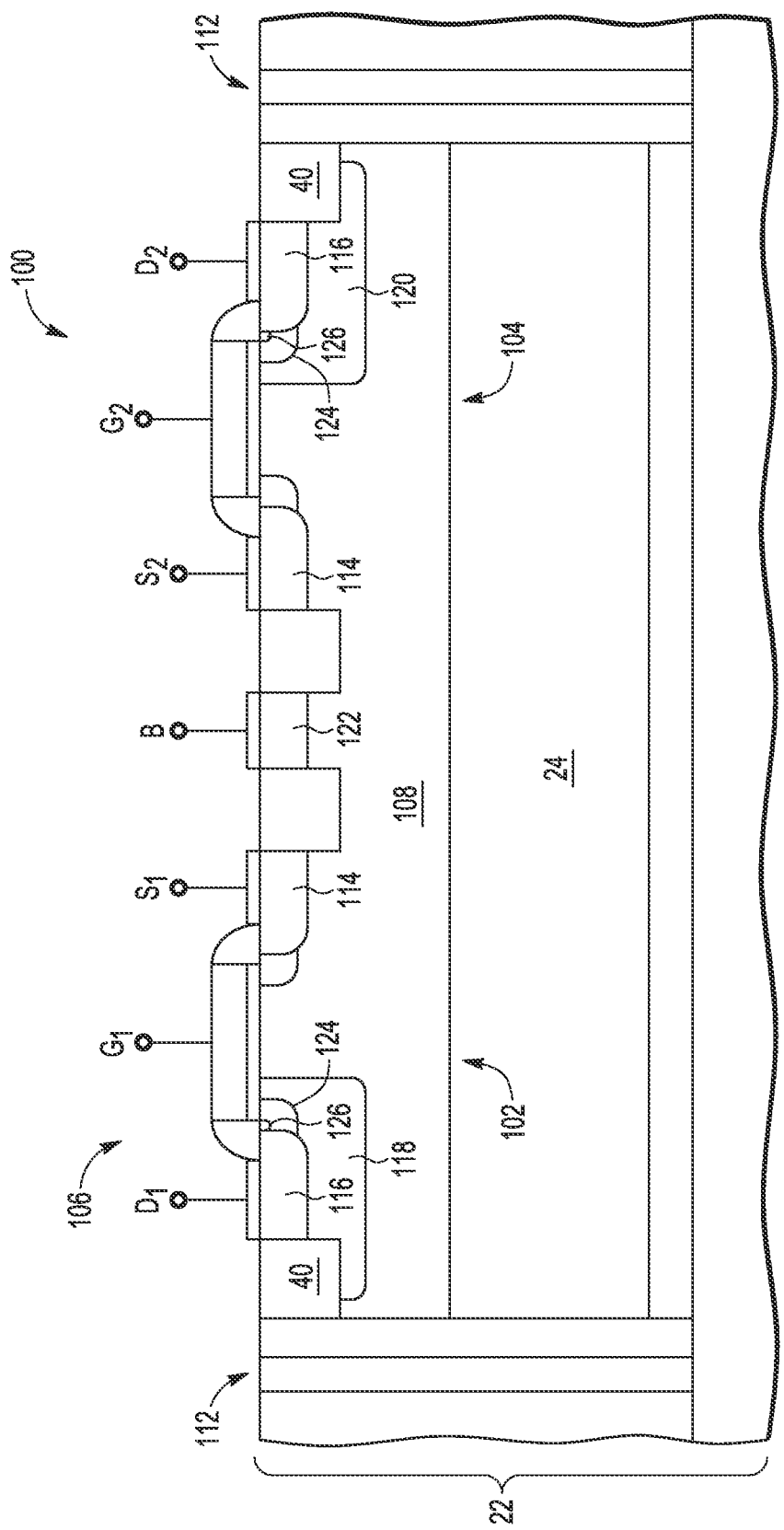
FIG. 2 is a cross-sectional, schematic view of a pair of the transistor devices of FIG. 1 in an exemplary merged configuration in accordance with one embodiment.

FIG. 2 shows an electronic apparatus 100 with multiple transistor devices to depict the mergeability of the above-described embodiments. In this example, the apparatus 100 has a pair of the analog FET devices 102, 104 disposed and, thus, merged, in a common device area 106. The devices 102, 104 share a common primary well region 108 of a composite body region in a semiconductor substrate. Each device 102, 104 may be configured in a manner similar to the embodiments of the device 20 described above in connection with FIG. 1. For example, the semiconductor substrate may be configured in a manner similar to the substrate 22 of FIG. 1. The device 102 includes source, gate, and drain terminals labeled S1, G1, and D1. The source, gate, and drain terminals of the device 104 are labeled S2, G2, and D2.

The merged devices 102, 104 are disposed within an isolation ring 112 disposed in the substrate 110. The isolation ring 112 may be configured in a manner similar to the isolation ring 32 of FIG. 1. For example, the isolation ring 112 may include one or more DTI regions that define a lateral periphery of the device area 106.

Source and drain regions 114, 116 of each device 102, 104 are disposed in the substrate 110 within the isolation ring 112. In this example, the source regions 114 are laterally spaced inward of the drain regions 116. In other cases, the lateral positions of the source and drain regions 114, 116 are switched. Respective channels are formed in the composite body region during operation as described above.

The primary well region 108 extends laterally across the source and drain regions 114, 116 of both devices 102, 104. The composite body region includes respective secondary well regions 118, 120 in the primary well region 108 for the devices 102, 104. Each secondary well region 118, 120 may be configured in a manner similar to the drain-side well region 70 described above in connection with FIG. 1. For example, in each device 102, 104, the drain region 116 is disposed on the respective secondary well region 118 or 120 such that charge carriers in the respective channel flow from the primary well region 108 into the respective secondary well region 118 or 120 to reach the respective drain region 116.

The composite body region includes a body contact region 122 in the primary well region 108. In the embodiment of FIG. 2, the body contact region 122 is centered within the device area 106. The devices 102, 104 may be laterally symmetrical about the body contact region 122. For example, the respective channels are symmetrically disposed about the body contact region 122. The merged devices may be arranged in other orientations or configurations, including other symmetrical arrangements as well as non-symmetrical arrangements.

The merged devices 102, 104 may also or alternatively be configured with source/drain extension regions as described above. In this embodiment, each device 102, 104 includes a drain extension region 124 disposed adjacent the respective drain region 116. A pocket 126 is disposed in each drain extension region 124 to establish a respective depletion region along a gate edge as described above.

Figure 3:
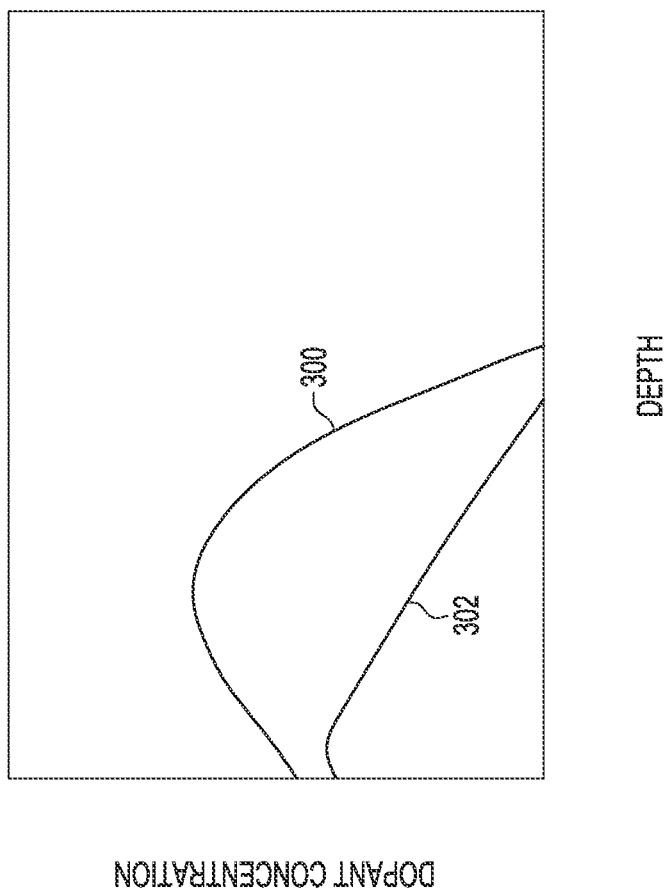
FIG. 3 is a graphical plot showing exemplary dopant implantation profiles for counter-doping the drain-side body region of the transistor device of FIG. 1 in accordance with one embodiment.

FIG. 3 is a graphical plot to depict exemplary dopant concentration profiles of implantation procedures used to form the above-described composite body regions. In this example, the primary well region of the composite body region is formed with an implantation procedure (e.g., p-well procedure) having a profile 300. The secondary well region is defined through counter-doping of the primary well region with an implantation procedure (e.g., n-comp procedure) having a profile 302.

The dopant (e.g., n-type dopant) of the n-comp procedure has a shallower dopant profile than the dopant (e.g., p-type dopant) of the p-well procedure. As shown in FIG. 3, the peak of the profile 302 is at a shallower depth than the peak of the profile 300. As a result, the lower boundaries of the primary and secondary well regions may be spaced apart as shown in FIGS. 1 and 2. In some examples, the spacing is about 0.2 µm to about 2 µm.

FIG. 3 also shows the relative differences in dopant concentration levels for the counter-doping. At the surface, the dopant concentration levels of the profiles 300, 302 may be relatively close to one another, e.g., within about one order of magnitude of one another.

Figure 4:
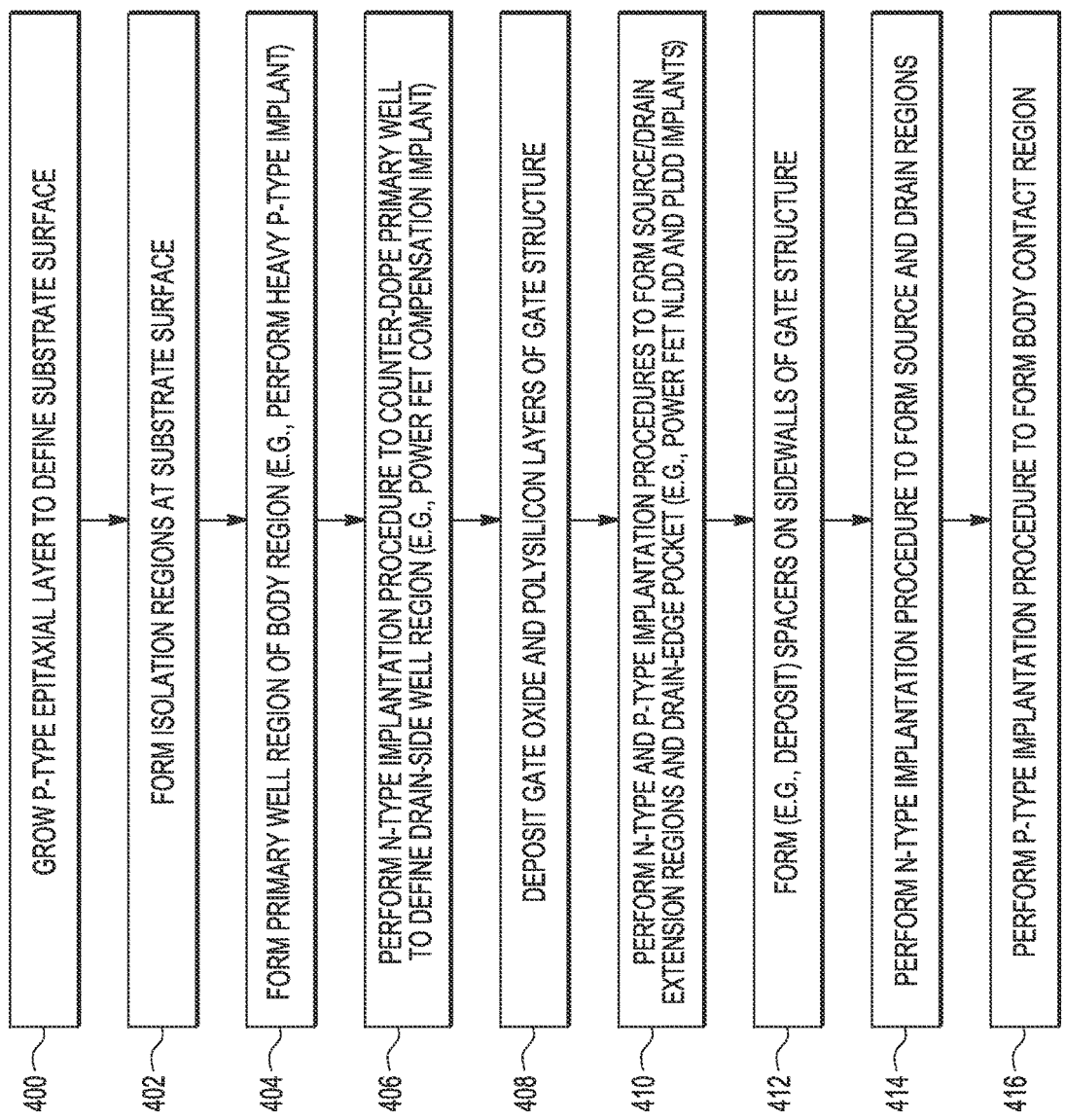
FIG. 4 is a flow diagram of an exemplary fabrication sequence to construct a mergeable transistor device having a counter-doped drain-side body region and a drain extension depletion pocket in accordance with one embodiment.

FIG. 4 shows an exemplary fabrication method for fabricating a mergeable transistor device with a customized drain-side body region and/or a gate-edge depletion pocket as described above. The transistor device is fabricated with a semiconductor substrate, the regions or layers of which may have the conductivity types of the n-channel transistor examples described above, or be alternatively configured to support a p-channel transistor device. The method includes a sequence of acts or steps, only the salient of which are depicted for convenience in illustration. The ordering of the acts may vary in other embodiments. For example, the implantation procedures may be performed in different orders.

The method may begin with, or include, an act 400 in which an epitaxial layer is grown on a base or original substrate. The p-type epitaxial layer may have a thickness of about 1 µm to about 10 µm. The growth of the epitaxial layer defines a surface of a semiconductor substrate in which the transistor device will be formed.

The semiconductor substrate may have an SOI construction as described above. In one example, the semiconductor substrate includes a buried oxide layer (e.g., 0.1 µm to about 3 µm) disposed on a lightly doped n-type handler wafer, and a p-type epitaxial layer (e.g., about 0.5 µm to about 3 µm) disposed on the buried oxide layer. The base substrate may include an n-type or p-type handle or other original semiconductor substrate on which the insulator, epitaxial, or other layers are grown or otherwise formed. Any number of epitaxial layers may be present or grown. In some cases, the SOI construction may be provided using other procedures not involving epitaxial growth of the semiconductor layer disposed on the buried insulating layer.

In an act 402, STI regions or other isolation trenches may be formed at the surface of the semiconductor substrate. The STI regions may be formed via any now known or hereafter developed procedure. For example, the act 402 may include the formation of a trench and the deposition, e.g., chemical vapor deposition (CVD), of one or more materials in the trench. In some embodiments, the trench is filled with silicon oxide. Additional or alternative materials may be deposited.

The act 402 may also include one or more procedures to define a lateral periphery of the device. Such procedures may include forming one or more DTI regions as shown in FIGS. 1 and 2. In one embodiment, the center of the deep isolation trenches may be filled with highly doped, e.g., n-type, polysilicon after deposition of the dielectric layers. The width of the deep isolation trenches may be about 1 µm to about 3 µm. The trenches may be formed with various procedures. In some cases, the deep isolation trenches may be formed or defined after the formation of shallow trench isolation (STI) regions, although the order in which the trenches are formed may differ.

In an act 404, a primary well region of the body region is formed in the semiconductor substrate. As described above, the formation of the primary well region may include performing a power FET well implantation procedure to implant dopant, e.g., p-type dopant, in the semiconductor substrate. The implantation procedure may be configured as a heavy implant as described above.

In an act 406, an implantation procedure is performed to counter-dope the primary well region with dopant, e.g., n-type dopant, to define a secondary well region of the body region. The implantation procedure may be configured to also form an accumulation region of a power FET device, as described above. The implantation procedures of the acts 404, 406 may be configured to establish, at a surface of the semiconductor substrate, a p-type concentration level less than one order of magnitude greater than an n-type concentration level. As described above in connection with FIG. 2, the implantation procedure of the act 406 may also be configured to define one or more additional secondary well regions for other devices merged within the same isolation ring.

Gate oxide and polysilicon layers of the gate structure are deposited on the surface of the semiconductor substrate in an act 408 before further implantation procedures are performed in an act 410. The procedures may be configured to form source/drain extension regions, e.g., NLDD or PLDD regions, of power FET devices. The gate oxide and polysilicon layers may be used as a mask for the implantation procedures. In an n-channel example, the n-type implantation procedure, e.g., the NLDD implant, is used to form source/drain extension regions of the present device, while the p-type implantation procedure, e.g., the PLDD implant, is used to form a pocket in the drain extension region. The p-type implantation procedure may be configured to establish a depletion region along an edge of the drain region at the gate edge as described above.

Sidewall spacers may then be formed on sidewalls of the gate structure layers in an act 412. The sidewall spacers may be deposited or formed in any manner.

In an act 414, an implantation procedure is then performed to form a source region in the primary well region and a drain region in the secondary well region. The implantation procedure may use the gate structure and sidewall spacers for alignment and masking. Multiple source and drain regions may be formed in embodiments having merged devices.

A body contact region is formed by an implantation procedure performed in an act 416. In this example, the implantation procedure is a p-type implantation procedure configured to also form the source/drain regions of p-channel FET devices.

The disclosed devices may be fabricated cost effectively during a process flow configured for one or more FET device designs. The disclosed devices may be fabricated without adding masks or procedures to the existing process flow. Process complexity need not increase to achieve the operational and performance benefits described above. However, in other embodiments, additional masks or procedures may be used. The implantation procedures implemented in one or more of the above-described acts may thus not correspond with implantation procedures performed and configured to fabricate regions of other FET devices.

Additional acts may be implemented at various points during the fabrication procedure. For example, one or more acts may be directed to depositing one or more passivation layers and metal layers. The acts may be implemented in various orders. Additional or alternative procedures may be implemented both before and after the acts shown in FIG. 4.

In a first aspect, a device includes a semiconductor substrate, source and drain regions disposed in the semiconductor substrate, having a first conductivity type, and laterally spaced from one another, and a composite body region disposed in the semiconductor substrate, having a second conductivity type, and in which a channel during operation is formed for charge carriers flowing from the source region to the drain region. The composite body region includes a first well region that extends laterally across the source and drain regions and a second well region disposed in the first well region. The drain region is disposed in the second well region such that the charge carriers flow from the first well region into the second well region to reach the drain region. The second well region includes dopant of the first conductivity type to have a lower net dopant concentration level than the first well region.

In a second aspect, a device includes a semiconductor substrate, source and drain regions disposed in the semiconductor substrate, having a first conductivity type, and laterally spaced from one another, a gate structure supported by the semiconductor substrate between the source and drain regions, a body region disposed in the semiconductor substrate, having a second conductivity type, and in which a channel is formed under the gate structure for charge carriers flowing from the source region to the drain region during operation, a drain extension region disposed adjacent the drain region, having the first conductivity type, and through which the charge carriers pass after exiting the channel, and a pocket in the drain extension region, having the second conductivity type, and configured to establish a depletion region along an edge of the gate structure.

In a third aspect, a method of fabricating a transistor device having a channel of a first conductivity type formed during operation in a body region having a second conductivity type, includes forming a first well region of the body region in a semiconductor substrate, performing a first implantation procedure to counter-dope the first well region with dopant of the first conductivity type to define a second well region of the body region, and performing a second implantation procedure to form a source region in the first well region and a drain region in the second well region.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a transistor device having a channel of a first conductivity type formed during operation in a body region having a second conductivity type, the method comprising:
forming a first well region of the body region in a semiconductor substrate;
performing a first implantation procedure to counter-dope the first well region with dopant of the first conductivity type to define a second well region of the body region, the first implantation procedure being configured to establish a net conductivity of the second conductivity type for the second well region; and
performing a second implantation procedure to form a source region in the first well region and a drain region in the second well region.

2. The method of claim 1, further comprising:
performing a third implantation procedure to implant dopant of the first conductivity type in the semiconductor substrate to form a drain extension region adjacent the drain region; and
performing a fourth implantation procedure to implant dopant of the second conductivity type to form a pocket in the drain extension region to establish a depletion region along an edge of the drain region.

3. The method of claim 2, wherein the fourth implantation procedure is configured to form a source/drain extension region of a power field-effect transistor (FET) device in the semiconductor substrate.

4. The method of claim 2, wherein the third and fourth implantation procedures are configured to form respective source/drain extension regions of power field-effect transistor (FET) devices in the semiconductor substrate.

5. The method of claim 2, wherein the pocket is disposed at a surface of the semiconductor substrate.

6. The method of claim 1, wherein the first implantation procedure is configured to form an accumulation region of a power field-effect transistor (FET) device in the semiconductor substrate.

7. The method of claim 1, wherein:
the transistor device is a first transistor device of a plurality of transistor devices;
performing the first implantation procedure is configured to further define a third well region of the body region, the third well region being associated with a second transistor device of the plurality of transistor devices; and
performing the second implantation procedure is configured to form a further source region in the first well region and a further drain region in the third well region, the further source and drain regions being associated with the second transistor device.

8. The method of claim 7, further comprising forming an isolation ring that defines an active area in which the transistor device is disposed, wherein the first well region extends across an entire lateral extent of the active area to abut the isolation ring.

9. The method of claim 1, wherein:
forming the first well region comprises performing a fifth implantation procedure to implant dopant of the second conductivity type in the semiconductor substrate; and
the fifth implantation procedure is configured to establish, at a surface of the semiconductor substrate, a concentration level of the dopant of the second conductivity type less than one order of magnitude greater than a concentration level of the dopant of the first conductivity type implanted by the first implantation procedure.

10. A method of fabricating a transistor device having a channel of a first conductivity type formed during operation in a body region having a second conductivity type, the method comprising:
forming an isolation ring that defines an active area in which the transistor device is disposed;
forming a first well region of the body region in a semiconductor substrate, the first well region extending across an entire lateral extent of the active area to abut the isolation ring;
performing a first implantation procedure to counter-dope the first well region with dopant of the first conductivity type to define a second well region of the body region, the first implantation procedure being configured to establish a net conductivity of the second conductivity type for the second well region; and performing a second implantation procedure to form a source region in the first well region and a drain region in the second well region.

11. The method of claim 10, further comprising:

performing a third implantation procedure to implant dopant of the first conductivity type in the semiconductor substrate to form a drain extension region adjacent the drain region; and performing a fourth implantation procedure to implant dopant of the second conductivity type to form a pocket in the drain extension region to establish a depletion region along an edge of the drain region.

12. The method of claim 11, wherein the fourth implantation procedure is configured to form a source/drain extension region of a power field-effect transistor (FET) device in the semiconductor substrate.

13. The method of claim 10, wherein the first implantation procedure is configured to form an accumulation region of a power field-effect transistor (FET) device in the semiconductor substrate.

14. The method of claim 10, wherein the transistor device is a first transistor device of a plurality of transistor devices disposed within the active area, each transistor device of the plurality of transistor devices having respective regions formed by the first and second implantation procedures.

15. The method of claim 10, wherein:

forming the first well region comprises performing a fifth implantation procedure to implant dopant of the second conductivity type in the semiconductor substrate; and the fifth implantation procedure is configured to establish, at a surface of the semiconductor substrate, a concentration level of the dopant of the second conductivity type less than one order of magnitude greater than a concentration level of the dopant of the first conductivity type implanted by the first implantation procedure.

16. A method of fabricating a transistor device having a channel of a first conductivity type formed during operation in a body region having a second conductivity type, the method comprising:

forming a first well region of the body region in a semiconductor substrate;

performing a first implantation procedure to counter-dope the first well region with dopant of the first conductivity type to define a second well region of the body region, the first implantation procedure being configured to establish a net conductivity of the second conductivity type for the second well region;

performing a second implantation procedure to form a source region in the first well region and a drain region in the second well region;

performing a third implantation procedure to implant dopant of the first conductivity type in the semiconductor substrate to form a drain extension region adjacent the drain region; and performing a fourth implantation procedure to implant dopant of the second conductivity type to form a pocket in the drain extension region to establish a depletion region along an edge of the drain region.

17. The method of claim 16, wherein the first implantation procedure is configured to form an accumulation region of a power field-effect transistor (FET) device in the semiconductor substrate.

18. The method of claim 16, wherein:

the transistor device is a first transistor device of a plurality of transistor devices;

performing the first implantation procedure is configured to further define a third well region of the body region, the third well region being associated with a second transistor device of the plurality of transistor devices; and performing the second implantation procedure is configured to form a further source region in the first well region and a further drain region in the third well region, the further source and drain regions being associated with the second transistor device.

19. The method of claim 18, further comprising forming an isolation ring that defines an active area in which the transistor device is disposed, wherein the first well region extends across an entire lateral extent of the active area to abut the isolation ring.

20. The method of claim 16, wherein:

forming the first well region comprises performing a fifth implantation procedure to implant dopant of the second conductivity type in the semiconductor substrate; and the fifth implantation procedure is configured to establish, at a surface of the semiconductor substrate, a concentration level of the dopant of the second conductivity type less than one order of magnitude greater than a concentration level of the dopant of the first conductivity type implanted by the first implantation procedure.

* * * * *